United States Patent [19]
Ohta et al.

[11] Patent Number: 5,105,075
[45] Date of Patent: Apr. 14, 1992

[54] PROJECTION EXPOSURE APPARATUS

[75] Inventors: Masakatu Ohta; Akiyoshi Suzuki, both of Tokyo, Japan

[73] Assignee: Canon Kabushiki Kaisha, Tokyo, Japan

[21] Appl. No.: 728,317

[22] Filed: Jul. 8, 1991

Related U.S. Application Data

[63] Continuation of Ser. No. 572,340, Aug. 24, 1990, abandoned, which is a continuation of Ser. No. 409,311, Sep. 19, 1989, abandoned.

[30] Foreign Application Priority Data

Sep. 19, 1988 [JP]  Japan .................................. 1-234096
Aug. 30, 1989 [JP]  Japan ................................. 64-226204

[51] Int. Cl.$^5$ ............................................. G01J 1/20
[52] U.S. Cl. ................................ 250/201.2; 355/53; 353/101
[58] Field of Search .................... 355/30, 53; 353/101; 250/201.2, 548, 557; 354/406, 407, 408

[56] References Cited

U.S. PATENT DOCUMENTS

| 4,669,842 | 6/1987 | Yomoda et al. | 353/101 |
| 4,699,505 | 10/1987 | Komoriya et al. | 355/30 |
| 4,725,722 | 2/1988 | Maeda et al. | 250/201.2 |
| 4,786,947 | 11/1988 | Kosugi et al. | 355/30 |
| 4,825,247 | 10/1989 | Kemi et al. | 355/30 |

FOREIGN PATENT DOCUMENTS

| 60-261137 | 12/1985 | Japan . |
| 61-160934 | 7/1986 | Japan . |
| 62-32613 | 2/1987 | Japan . |
| 62-35620 | 2/1987 | Japan . |

Primary Examiner—David C. Nelms
Attorney, Agent, or Firm—Fitzpatrick, Cella, Harper & Scinto

[57] ABSTRACT

A projection exposure apparatus includes a projection optical system for projecting an image of a pattern of a first object to a second object, and an adjusting system for adjusting projection magnification and distortion of the projected image of the pattern, the adjusting system being operable to displace the first object and a lens element of the projection optical system in a direction of an optical axis of the projection optical system.

23 Claims, 4 Drawing Sheets

PROJECTION EXPOSURE APPARATUS

This application is a continuation of prior application, Ser. No. 07/572,340 filed Aug. 24, 1990, which application was a continuation of prior application, Ser. No. 07/409,311 filed Sept. 19, 1989, both now abandoned.

FIELD OF THE INVENTION AND RELATED ART

This invention relates to a projection exposure apparatus and, more particularly, to a projection exposure apparatus for use in the manufacture of semiconductor microcircuit devices, for projecting a circuit pattern of a reticle to a semiconductor wafer through a projection lens system.

In projection exposure apparatuses for manufacture of semiconductor chips such as integrated circuits, large scaled integrated circuits or otherwise, one important problem is enhancement of precision with regard to superposition of an image of a circuit pattern projected by a projection lens system on a semiconductor wafer, onto a circuit pattern having been formed on the wafer through a preceding process. As the factors which influence the superposing precision, there are error in the projection magnification of the projected image of the pattern and error with regard to the distortion of the projected image of the pattern, those problems being discussed in Japanese Laid-Open Patent Application Sho 62-35620. Those errors have to be sufficiently corrected before the image of the pattern is projected on the wafer for actual exposure.

SUMMARY OF THE INVENTION

It is accordingly an object of the present invention to provide a unique and improved projection exposure apparatus in which both the projection magnification error and the distortion error can be corrected satisfactorily.

In accordance with an aspect of the present invention, to achieve the above object, there is provided a projection exposure apparatus, comprising: a projection optical system for projecting an image of a pattern of a first object to a second object; and adjusting means for adjusting a projection magnification and distortion of the projected image of the pattern, said adjusting means being operable to displace the first object and one or more lens elements of said projection optical system in a direction of an optical axis of said projection optical system.

In accordance with one preferred form of the present invention, a projection exposure apparatus includes a projection optical system which is non-telecentric on the object side, but is telecentric on the image side and which is adapted to project an image of a pattern of a first object, placed on the object side, to a second object placed on the image side, and an adjusting means for displacing the first object in the direction of an optical axis of the projection optical system for adjustment of the projection magnification of the projected image of the pattern and also to displace at least one of the lens elements of the projection optical system, which is closest to the first object, in the direction of the optical axis of the projection optical system for adjustment of distortion of the projected image of the pattern.

In accordance with another preferred form of the present invention, a projection exposure apparatus includes a projection optical system which is telecentric both on the object side and on the image side and which is adapted to project an image of a pattern of a first object, placed on the object side, to a second object placed on the image side, and an adjusting means for displacing at least one of the lenses of the projection optical system, which is closest to or close to the first object, in a direction of an optical axis of the projection optical system for adjustment of the projection magnification of the projected image of the pattern and also to displace the first object in the direction of the optical axis of the projection optical system for adjustment of distortion of the image of the pattern.

These and other objects, features and advantages of the present invention will become more apparent upon consideration of the following description of the preferred embodiments of the present invention taken in conjunction with the accompanying drawings.

DESCRIPTION OF THE PREFERRED EMBODIMENTS

Figure 1:
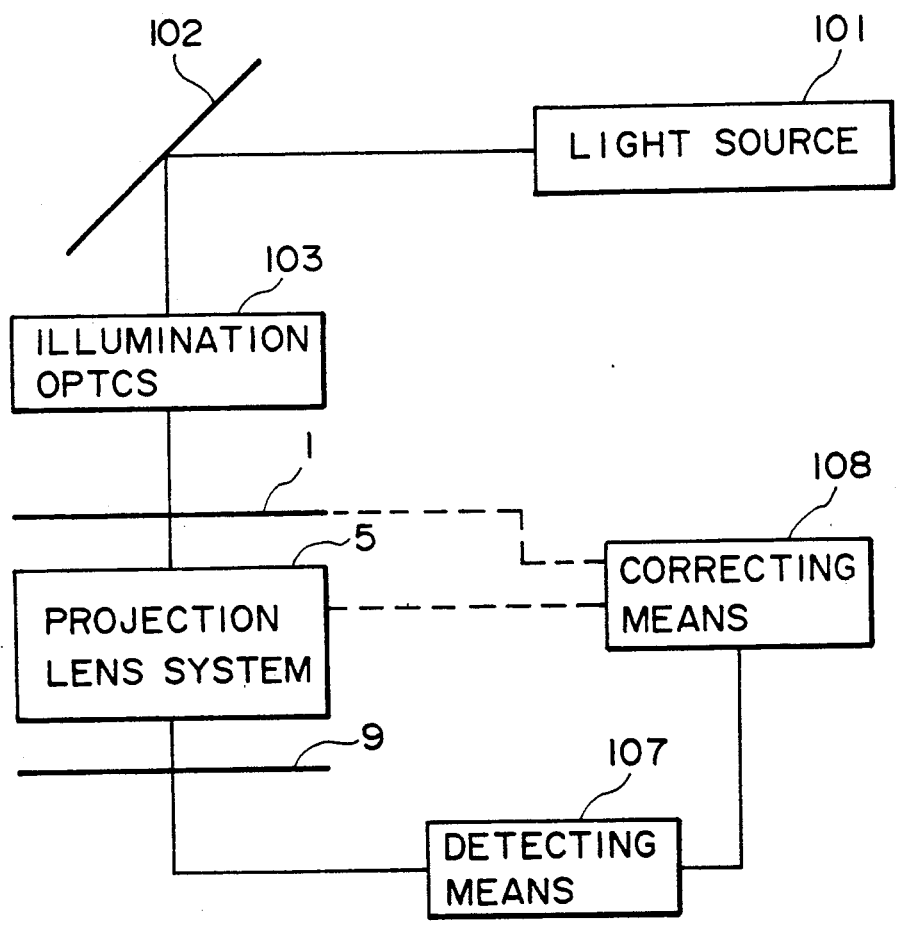
FIG. 1 is a block diagram, schematically showing a projection exposure apparatus according to an embodiment of the present invention.

FIG. 1 is a block diagram, showing one embodiment wherein the invention is applied to a projection exposure apparatus for manufacture of semiconductor devices.

Denoted in this Figure at 101 is a light source unit which comprises a super-high pressure Hg lamp, an elliptical mirror, an interference filter, a lens assembly and the like and which is adapted to emit light of g-line. Denoted at 102 is a reflection mirror for reflecting light from the light source unit 101 toward an illumination optical system 103. The illumination optical system 103 receives the light from the reflection mirror 102 and illuminates a reticle 1 on which a fine electronic circuit pattern for IC, LSI or otherwise is formed. Denoted at 5 is a projection lens system for projecting, at a predetermined reducing magnification, an image of the circuit pattern of the reticle 1 to a wafer 9. The projection lens system 5 is structured to be non-telecentric on the reticle 1 side, but to be telecentric on the wafer 9 side.

Denoted at 107 is a detecting means for detecting any magnification error and distortion of the projected image of the pattern of the reticle 1. By way of example, a photoelectric converting means (not shown) such as a two-dimensional image pickup element is disposed at the position of the wafer 9 surface or at a position equivalent thereto. By this photoelectric converting means, the image of the pattern projected by the projection lens system 5 is photoelectrically converted into a video signal. The detecting means 107 receives the video signal and determines the position coordinate of each of a number of predetermined points of the projected image of the pattern, with respect to an X-Y coordinate system having been set on a plane (imaginary plane) which is orthogonal to an optical axis of the projection lens system 5. Then, with regard to each point of the pattern image, the detecting means 107 calculates a deviation of the detected position coordinate of each point from a preset reference coordinate (reference grid, for example) of the X-Y coordinate system having been memorized into a memory of the detecting means 107. On the basis of the thus obtained deviations, the detecting means 107 detects any error in the projection magnification of the projected image of the pattern as well as any distortion (which may result chiefly from symmetrical distortion aberration of the projection lens system 5), and produces signals corresponding to the detected errors.

As an alternative, a pattern of a reticle may be actually printed on a wafer having a resist surface layer and, after development, any error in the projection magnification as well as distortion of the printed pattern may be measured by using a separate measuring device.

Denoted at 108 is a correcting means which is operable in response to the output signals from the detecting means 107 to change the distance (spacing) $S_1$ between the reticle 1 and the projection lens system 5 as well as one of the lens spacings of the lens elements constituting the projection lens system 5.

In the present embodiment structured such as described above, the spacing $S_1$ as well as one of the spacings of the lenses of the projection optical system are adjusted, by which any error in the projection magnification of the image of the reticle pattern projected by the projection lens system as well as any distortion error of the projected image can be corrected satisfactorily, without causing deterioration of various aberrations due to displacement of the reticle and a lens or lenses.

The correcting means 108 of the present embodiment includes a reticle driving device (not shown) and a lens driving device (also not shown). The reticle driving device is operable to displace the reticle 1 in the direction of the optical axis of the projection lens system 5. On the other hand, the lens driving device is operable to displace one or more lenses of the projection optical system 5, closest to or close to the reticle 1, in the direction of the optical axis of the projection optical system. These driving devices may be those of known type, such as disclosed in Japanese Laid-Open Patent Application Sho 62-32613 or Japanese Laid-Open Patent Application Sho 60-261137, and details of these driving devices are omitted here for simplicity.

Next, details of the lens structure of the projection optical system of the present embodiment will be explained.

Figure 2:
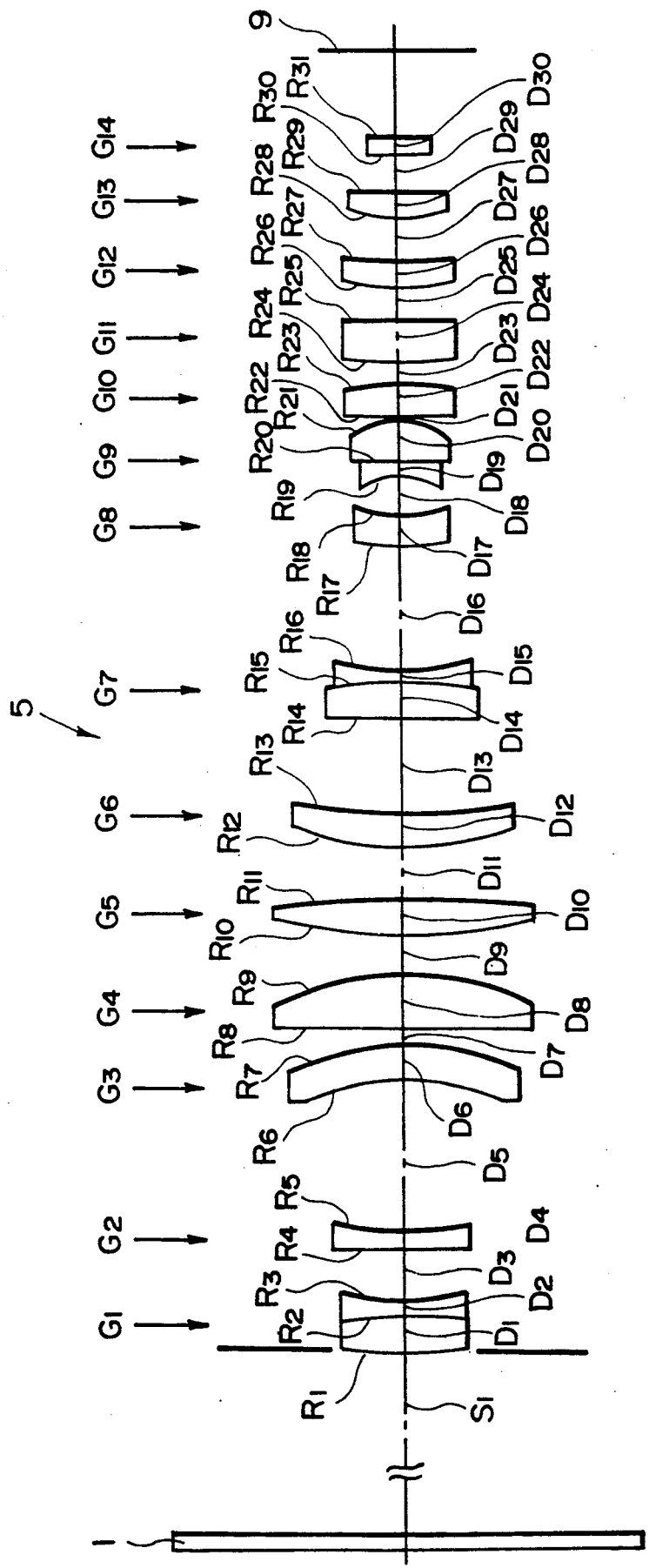
FIG. 2 is a section, showing the structure of a projection lens system of the projection exposure apparatus according to the FIG. 1 embodiment.

FIG. 2 is a section of the projection lens system 5 used in the FIG. 1 apparatus.

Denoted in this Figure at 1 is a reticle on which an electronic circuit pattern is formed. Denoted at $G_1$ through $G_{14}$ are lenses which constitute the projection lens system 5; and denoted at 9 is a wafer which is placed at a best imaging plane of the projection lens system 5. Character $S_1$ denotes the distance (on-axis air spacing) between the reticle 1 and the projection lens system 5.

Numerical data of the projection lens system 5 of the present embodiment is set forth in Table 1.

In this numerical example, $R_i$ (i=1-31) denotes the curvature radius (mm) of the i-th lens surface in an order from the object side (reticle 1 side); $D_i$(i=1-30) is the on-axis air spacing or on-axis lens thickness (mm) between the i-th surface and the (i+1)-th surface, in an order from the object side; $N_i$ (i=1-17) denotes the refractive index of the i-th lens element in an order from the object side; and $S_1$ is the on-axis air spacing (mm) between the reticle 1 and the lens $G_1$.

TABLE 1

$S_i = 259.819$

| | | | |
|---|---|---|---|
| G1 | $R_1 = 143.86$ | $D_1 = 9.975$ | $N_1 = 1.50415$ |
| | $R_2 = -81.46$ | $D_2 = 3.429$ | $N_2 = 1.60250$ |
| | $R_3 = 51.49$ | $D_3 = 14.028$ | |
| G2 | $R_4 = 540.12$ | $D_4 = 4.987$ | $N_3 = 1.60250$ |
| | $R_5 = 62.56$ | $D_5 = 41.773$ | |
| G3 | $R_6 = -68.02$ | $D_6 = 9.664$ | $N_4 = 1.56226$ |
| | $R_7 = -74.29$ | $D_7 = 4.052$ | |
| G4 | $R_8 = 1355.17$ | $D_8 = 15.587$ | $N_5 = 1.50415$ |
| | $R_9 = -73.55$ | $D_9 = 10.287$ | |
| G5 | $R_{10} = 135.96$ | $D_{10} = 10.599$ | $N_6 = 1.53639$ |
| | $R_{11} = -200.04$ | $D_{11} = 13.093$ | |
| G6 | $R_{12} = 81.78$ | $D_{12} = 9.352$ | $N_7 = 1.56226$ |
| | $R_{13} = 160.24$ | $D_{13} = 24.004$ | |
| G7 | $R_{14} = -463.01$ | $D_{14} = 9.664$ | $N_8 = 1.53639$ |
| | $R_{15} = -146.45$ | $D_{15} = 2.805$ | $N_9 = 1.60250$ |
| | $R_{16} = 64.24$ | $D_{16} = 34.915$ | |
| G8 | $R_{17} = 49.49$ | $D_{17} = 8.417$ | $N_{10} = 1.62753$ |
| | $R_{18} = 30.04$ | $D_{18} = 11.222$ | |
| G9 | $R_{19} = -16.99$ | $D_{19} = 2.493$ | $N_{11} = 1.60250$ |
| | $R_{20} = 351.55$ | $D_{20} = 11.534$ | $N_{12} = 1.50415$ |
| | $R_{21} = -22.57$ | $D_{21} = 1.247$ | |
| G10 | $R_{22} = -654.15$ | $D_{22} = 9.975$ | $N_{13} = 1.50415$ |
| | $R_{23} = -74.32$ | $D_{23} = 4.751$ | |
| G11 | $R_{24} = 153.24$ | $D_{24} = 11.534$ | $N_{14} = 1.53639$ |
| | $R_{25} = -275.84$ | $D_{25} = 8.728$ | |
| G12 | $R_{26} = 50.46$ | $D_{26} = 7.170$ | $N_{15} = 1.56226$ |
| | $R_{27} = 144.70$ | $D_{27} = 10.911$ | |
| G13 | $R_{28} = 41.10$ | $D_{28} = 7.274$ | $N_{16} = 1.56226$ |
| | $R_{29} = -387.53$ | $D_{29} = 11.222$ | |
| G14 | $R_{30} = -95.33$ | $D_{30} = 3.117$ | $N_{17} = 1.62753$ |
| | $R_{31} = -291.36$ | | |

Table 2 shows the amount of shift ($\Delta SD$) (hereinafter "symmetrical distortion change $\Delta SD$") of the image point at an image height of 10 mm on the image surface of the projection lens system, according to Table 1, resulting from a change in the symmetrical distortion aberration, as well as the amount of shift ($\Delta \beta$) (hereinafter referred to as "projection magnification change $\Delta \beta$") of that image point resulting from a change in the projection magnification, which occur when the on-axis spacing $S_1$ between the reticle 1 and the lens $G_1$ as well as the on-axis spacing $D_3$, $D_5$, $D_7$, $D_9$, $D_{11}$, $D_{13}$, $D_{16}$, $D_{18}$, $D_{21}$, $D_{23}$, $D_{25}$, $D_{27}$ or $D_{29}$ of adjacent lenses $G_i$ and $G_{i+1}$ (i=1-13) are changed individually, each by 1 mm. Also, in Table 2, there is shown the ratio $|\Delta SD/\Delta \beta|$ between these shifts. In Table 2, a sign "positive" is assigned to the shift of the image point which is in a direction away from the optical axis of the projection lens system, while a sign "negative" is assigned to the shift of the image point which is in a direction toward the optical axis of the projection lens system.

TABLE 2

| | $\Delta SD$ (micron) | $\Delta \beta$ (micron) | $\Delta SD/\Delta \beta$ |
|---|---|---|---|
| $S_1$ | 0.8 | 26 | 0.031 |
| $l_1$ | 49.3 | 5 | 9.87 |
| $l_2$ | 546.2 | −138 | 3.96 |
| $l_3$ | 515.3 | −136 | 3.79 |
| $l_4$ | −6.9 | 7 | 0.98 |

TABLE 2-continued

|  | ΔSD (micron) | Δβ (micron) | ΔSD/Δβ |
|---|---|---|---|
| l₅ | 102.5 | −148 | 0.69 |
| l₆ | 145.5 | −331 | 0.44 |
| l₇ | 31.8 | −58 | 0.55 |
| l₈ | 40.3 | 12 | 3.36 |
| l₉ | 15.4 | 55 | 0.28 |
| l₁₀ | 6.3 | −10 | 0.63 |
| l₁₁ | 3.8 | −53 | 0.07 |
| l₁₂ | 5.4 | −71 | 0.08 |
| l₁₃ | 1.0 | 47 | 0.02 |

Based on Table 2, in the present embodiment, both the spacing $S_1$ and the spacing $D_3$ (with which aberration other than the symmetrical distortion is small) are adjusted for adjustment of the projection magnification and the symmetrical distortion.

When the change in the spacing $S_1$ is denoted by $\Delta S_1$ and the change in the spacing $D_3$ is denoted by $\Delta l_1$, then from Table 2 the changes $\Delta SD$ and $\Delta \beta$ in the symmetrical distortion and the projection magnification can be expressed as follows:

$$\Delta SD = 0.8 \times \Delta S_1 + 49.3 \times \Delta D_3$$

$$\Delta \beta = 26 \times S_1 + 5 \times \Delta D_3 \quad (2)$$

Accordingly, once correction target values for the symmetrical distortion and the magnification projection are given, the changes $\Delta S_1$ and $\Delta D_3$ can be given by:

$$\Delta S_1 = -k(5 \times \Delta SD - 49.3 \times \Delta \beta)$$

$$\Delta D_3 = k(26 \times \Delta SD - 0.8 \times \Delta \beta) \quad (2)$$

wherein $k = (1277.8)^{-1}$

By using these values, it is now possible to satisfactorily correct both the projection magnification error and the symmetrical distortion error due to a change in pressure, temperature, humidity or otherwise.

The change in aberration of the projection lens system 5 which results from a change in the spacing $S_1$ (i.e. the distance between the reticle 1 and the projection lens system 5), is small as compared with the change in paraxial value such as the projection magnification or focus position, for example, and the ratio between the change in the magnitude of aberration and the change in the paraxial value, that is $$\frac{\text{(Change in Magnitude of Aberration)}}{\text{(Change in Paraxial Value)}}$$

is small. This is because the inclination of a light ray in the projection lens system 5 is large as compared with the inclination of a light ray between the object surface and the projection lens system and that, if the air spacing between lenses changes, there occurs a large difference in the height of incidence of the light ray at a refracting surface of the lens, thus causing a large aberration change. Accordingly, in the present embodiment wherein a projection lens system 5 which is telecentric only on the image side is used, the adjustment of distortion is made mainly by adjusting the spacings $S_1$ and $D_3$ through the movement of the lens $G_1$, while the adjustment of the projection magnification is made mainly by adjusting the spacing $S_1$ through the movement of the reticle 1. In this manner, both the projection magnification error and the symmetrical distortion error in the projection exposure apparatus can be corrected.

While in the present embodiment the reticle 1 and the lens $G_1$ close to the reticle 1 are displaced for execution of adjustment of the projection magnification and the distortion, according to the type of projection lens system used, it is possible to structure the apparatus so that the reticle and a lens element, not close to the reticle, can be displaced. As a further alternative, a plurality of lens elements may be displaced.

Figure 3:
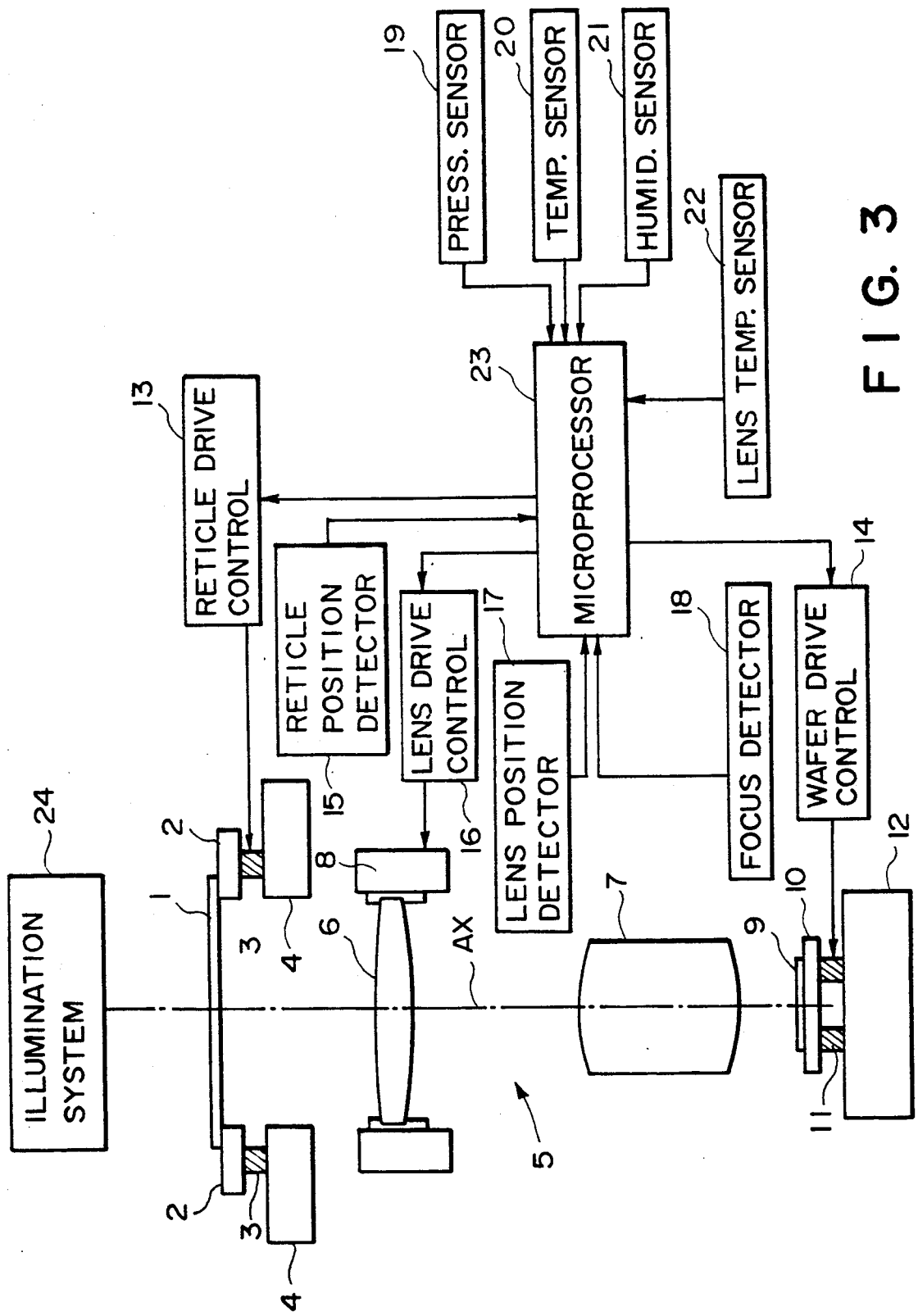
FIG. 3 is a schematic and diagrammatic view of a projection exposure apparatus according to another embodiment of the present invention.

FIG. 3 is a schematic and diagrammatic view of a projection exposure apparatus according to another embodiment of the present invention.

Denoted in FIG. 3 at 1 is a reticle on which a fine electronic circuit pattern is formed; at 2 is a reticle chuck for holding the reticle 1 by attraction; at 3 is a reticle driving device mounted to the reticle chuck 2; at 4 is a reticle stage for supporting the reticle driving device 4; at 5 is a reduction projection lens system which is telecentric both on the object side and on the image side; at 6 is lens (hereinafter referred to as a "field lens") of the projection lens system 5, which lens is disposed close to the reticle 1; at 7 is a lens system which is constituted by other lenses of the projection lens system 5; at 8 is a lens driving device for displacing the field lens 7 in a direction of an optical axis AX of the projection lens system 5; at 9 is a wafer which is coated with a radiation sensitive material such as resist, for example; at 10 is a wafer chuck for holding the wafer 9 by attraction; at 11 is a wafer driving device mounted to the wafer chuck 9; and at 12 is a wafer stage for supporting the wafer driving device 11 and being movable in a plane perpendicular to the optical axis AX of the projection lens system 5.

The reticle driving device 3 and the wafer driving device 11 each may comprise a piezoelectric device, for example. The reticle driving device 3 is operable to displace the reticle chuck 2 along the optical axis AX of the projection lens system 5 to thereby move the reticle 1 along the optical axis AX. The wafer driving device 11 is operable to displace the wafer chuck 10 along the optical axis AX of the projection lens system 5, to thereby move the wafer 9 along the optical axis AX. On the other hand, the lens driving device 8 functions to move the field lens 6 along the optical axis AX of the projection lens system 5, by using a pneumatic pressure. The lens driving device 8 may be of a known type such as disclosed in the aforementioned Japanese-Laid-Open Patent Application Sho 62-32613, and details of it are omitted here for simplicity.

The drive of the reticle chuck 2 by the reticle driving device 3 is executed in accordance with a signal from a reticle drive control system 13 and, here, the position of the reticle 1 in the direction of the optical axis AX can be detected by a reticle position detector 15. Similarly, the drive of the field lens 8 by the lens driving device 8 is executed in accordance with a signal from a lens drive control system 16 and, here, the position of the field lens 8 in the direction of the optical axis AX can be detected by a lens position detector 17. The reticle position detector 15 and the lens position detector 17 each may comprise any one of various position detectors, an example of which is an optical encoder. The drive of the wafer chuck 10 by the wafer driving device 11 is executed in accordance with a signal from a wafer drive control system 14 and, here, the position of the wafer 9 (the surface thereof) in the direction of the optical axis AX can be detected by a focus detector 18. The focus detector 18 may comprise an air sensor or an optical sensor of a known type having been used conventionally in this type of projection exposure apparatus. The signals from the reticle position detector 15, the lens position detector 17 and the focus detector 18 are supplied into a microprocessor 23. On the other hand, in order to allow detection of any change in pressure, temperature and humidity around the projection lens system 5, there are provided a pressure sensor 19, a temperature sensor 20 and a humidity sensor 21. Also, for detection of any change in temperature of the projection lens system 5 due to absorption of light, there is provided a lens temperature sensor 22. Similarly, the signals from these sensors 19, 20, 21 and 22 are supplied into the microprocessor 23. The reticle drive control system 13, the lens drive control system 16 and the wafer drive control system 14 are all controlled by the microprocessor 23.

Denoted at 24 is an illumination system for illuminating the circuit pattern of the reticle 1 with uniform illuminance. In this embodiment, the illumination system 24 includes a light source for exposure which comprises a KrF excimer laser that can emit a laser beam of a wavelength $\lambda = 248.4$ nm. The laser beam from the illumination system 24 is directed through the reticle 1 and the projection lens system 5 to the wafer 9, whereby an image of the circuit pattern of the reticle 1 is projected on the wafer 9. In this embodiment, for projection exposure by use of a laser beam having a wavelength in a deep UV region, the lens elements constituting the projection lens system 5 are made of the same material of synthetic quartz ($SiO_2$) having a high transmission factor with respect to light of a wavelength $\lambda = 248.4$ nm.

Figure 4:
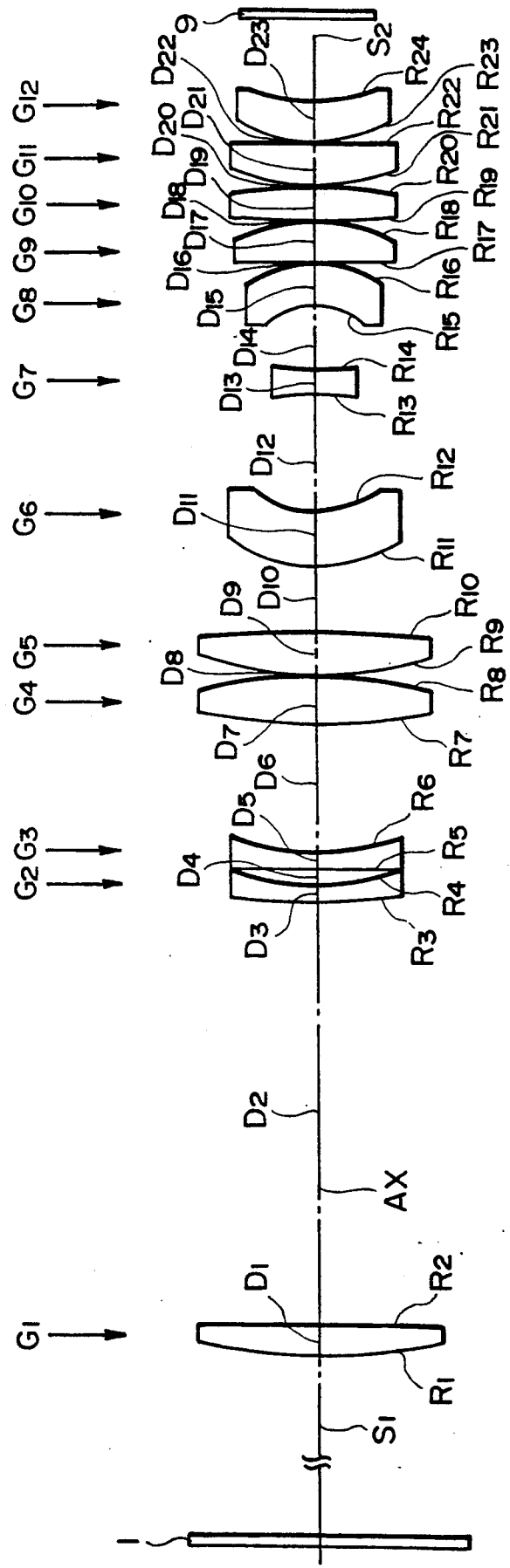
FIG. 4 is a section, showing the structure of a projection lens system of the projection exposure apparatus according to the FIG. 3 embodiment.

Details of the structure of the projection lens system 5 are such as illustrated in FIG. 4 which is a sectional view of the projection lens system 5. As illustrated, the projection lens system 5 is constituted by twelve lens elements, denoted at $G_1$ through $G_{12}$, which are disposed between the reticle 1 and the wafer 9 and are arranged along the optical axis AX. One lens denoted at $G_1$ in FIG. 4 corresponds to the field lens 6 shown in FIG. 2. Also, a lens group denoted at $G_2$ through $G_{12}$ corresponds to the lens system 7 shown in FIG. 3.

Numerical lens data of the projection lens system shown in FIG. 4 are set forth in Table 3. In Table 3, $R_i$ (i = 1-24) denotes the curvature radius (mm) of the i-th lens surface counted in an order from the object side (reticle 1 side); $D_i$ (i = 1-23) denotes the on-axis lens thickness or on-axis air spacing (mm) between the i-th lens surface and the (i+1)-th lens surface, counted in an order from the object side; and $N_i$ (i = 1-12) denotes the refractive index of the lens $G_i$ (i = 1-12). Further, $S_1$ denotes the on-axis air spacing (mm) between the circuit pattern bearing surface of the reticle 1 and the surface of the lens $G_1$, facing the reticle 1 side; and $S_2$ denotes the on-axis air spacing (mm) between the wafer 9 surface and the surface of the lens $G_{12}$, facing the wafer 9 side.

TABLE 3

|  |  |  |  |  |
|---|---|---|---|---|
|  |  | $S_1 = 100.0000$ |  |  |
| G1 | $R_1 = 223.62115$ | $D_1 = 15.00000$ | $N_1 = 1.521130$ |  |
|  | $R_2 = -3002.34716$ | $D_2 = 198.58486$ |  |  |
| G2 | $R_3 = 447.09682$ | $D_3 = 8.00000$ | $N_2 = 1.521130$ |  |
|  | $R_4 = 120.41202$ | $D_4 = 6.85000$ |  |  |
| G3 | $R_5 = 1361.15326$ | $D_5 = 8.00000$ | $N_3 = 1.521130$ |  |
|  | $R_6 = 116.03892$ | $D_6 = 60.00000$ |  |  |
|  | $R_7 = 233.10252$ | $D_7 = 24.00000$ | $N_4 = 1.521130$ |  |

TABLE 3-continued

| G4 | $R_8 = -194.78245$ | $D_8 = 1.00000$ |  |
|---|---|---|---|
| G5 | $R_9 = 183.54325$ | $D_9 = 20.00000$ | $N_5 = 1.521130$ |
|  | $R_{10} = -539.45990$ | $D_{10} = 30.00000$ |  |
| G6 | $R_{11} = 68.35126$ | $D_{11} = 27.00000$ | $N_6 = 1.521130$ |
|  | $R_{12} = 49.48403$ | $D_{12} = 55.00000$ |  |
| G7 | $R_{13} = -74.38180$ | $D_{13} = 12.00000$ | $N_7 = 1.521130$ |
|  | $R_{14} = 121.20157$ | $D_{14} = 30.00000$ |  |
| G8 | $R_{15} = -36.94984$ | $D_{15} = 20.00000$ | $N_8 = 1.521130$ |
|  | $R_{16} = -53.05412$ | $D_{16} = 1.00000$ |  |
| G9 | $R_{17} = -664.38932$ | $D_{17} = 18.00000$ | $N_9 = 1.521130$ |
|  | $R_{18} = -89.10035$ | $D_{18} = 1.00000$ |  |
| G10 | $R_{19} = 358.30545$ | $D_{19} = 16.50000$ | $N_{10} = 1.521130$ |
|  | $R_{20} = -215.20590$ | $D_{20} = 1.00000$ |  |
| G11 | $R_{21} = 122.34875$ | $D_{21} = 18.50000$ | $N_{11} = 1.521130$ |
|  | $R_{22} = 608.00265$ | $D_{22} = 1.00000$ |  |
| G12 | $R_{23} = 68.11099$ | $D_{23} = 20.00000$ | $N_{12} = 1.521130$ |
|  | $R_{24} = 103.07287$ | $S_2 = 73.14190$ |  |

Table 4 shows the amount of shift ($\Delta SD$) (hereinafter "symmetrical distortion change $\Delta SD$") of the image point at an image height of 10 mm on the image surface of the projection lens system, according to Table 3, resulting from a change in the symmetrical distortion aberration, and the amount of shift ($\Delta \beta$) (hereinafter referred to as "projection magnification change $\Delta \beta$") of that image point resulting from a change in the projection magnification, which occur when the on-axis spacing $S_1$ between the reticle 1 and the lens $G_1$, the on-axis air spacing $S_2$ between the lens $G_{12}$ and the wafer 9, and the on-axis air spacing $D_{2i}$ (i = 1-11) between adjacent lenses $G_i$ and $G_{i+1}$ (i = 1-11), are changed individually, each by 1 mm. Also, in Table 4, there is shown the ratio $|\Delta SD/\Delta \beta|$ between these shifts. In Table 4, a sign "positive" is assigned to the shift of the image point which is in a direction away from the optical axis of the projection lens system, and a sign "negative" is assigned to the shift of the image point which is in a direction toward the optical axis of the projection lens system.

TABLE 4

|  | $\Delta SD$ (micron) | $\Delta \beta$ (micron) | $|\Delta SD/\Delta \beta|$ |
|---|---|---|---|
| $S_1$ | 0.77 | 0 | ∞ |
| $D_2$ | 1.08 | −20 | 0.054 |
| $D_4$ | 1.03 | −15 | 0.068 |
| $D_6$ | 4.40 | 20 | 0.22 |
| $D_8$ | −0.33 | −10 | 0.033 |
| $D_{10}$ | −0.32 | 45 | 0.007 |
| $D_{12}$ | 0.19 | 35 | 0.005 |
| $D_{14}$ | −0.24 | −75 | 0.003 |
| $D_{16}$ | 0.58 | −90 | 0.006 |
| $D_{18}$ | −0.67 | −10 | 0.067 |
| $D_{20}$ | −0.39 | 20 | 0.020 |
| $D_{22}$ | 0.20 | 20 | 0.01 |
| $S_2$ | 0 | 0 | 0 |

Based on Table 4, in the present embodiment both the spacings $S_1$ and $D_2$ (with which the change in aberration other than the symmetrical distortion aberration is small) are adjusted for adjustment of the projection magnification and the symmetrical distortion.

When the change in the spacing $S_1$ is denoted by $\Delta S_1$ and the change in the spacing $D_2$ is denoted by $\Delta D_2$, then from Table 4 the changes $\Delta SD$ and $\Delta \beta$ in the symmetrical distortion and the projection magnification can be expressed such as follows:

$$\Delta SD = 0.77 \times \Delta S_1 + 1.08 \times \Delta D_2$$

$$\Delta \beta = -20 \times \Delta D_2 \quad (3)$$

Accordingly, the changes $\Delta D_2$ and $\Delta S_1$ can be given by:

$$\Delta S_1 = k_1(20 \times \Delta SD + 1.08 \times \Delta \beta)$$

$$\Delta D_2 = 1/20 \times \Delta \beta \quad (4)$$

wherein $k_1 = (15.4)^{-1}$

The change in aberration of the projection lens system 5 which results from a change in the spacing $S_1$ (i.e. the distance between the reticle 1 and the projection lens system 5), is small as compared with the change in paraxial value such as the projection magnification or focus position, for example, and the ratio between the change in the magnitude of aberration and the change in the paraxial value, that is $$\frac{\text{(Change in Magnitude of Aberration)}}{\text{(Change in Paraxial Value)}}$$

is small. This is because the inclination of a light ray in the projection lens system 5 is large as compared with the inclination of a light ray between the object surface and the projection lens system and that, if the air spacing between lenses changes, there occurs a large difference in the height of incidence of the light ray at a refracting surface of the lens, thus causing a large aberration change.

Accordingly, in the present embodiment which uses a projection lens system 5 that is telecentric both on the object side and on the image side, the adjustment of the projection magnification is made mainly by adjusting the spacings $S_1$ and $D_2$ through the movement of the lens $G_1$ (field lens 6), while the adjustment of distortion is made mainly by adjusting the spacing $S_1$ through the movement of the reticle 1. In this manner, both the projection magnification error and the symmetrical distortion error in the projection exposure apparatus can be corrected.

Referring back to FIG. 3, description will be made of details of the manner of correcting the projection magnification error and the distortion error of a projected image of a pattern, in the projection exposure apparatus of the present embodiment.

The microprocessor 23 has a memory in which calculating equations for obtaining the projection magnification change $\Delta \beta$ and the distortion change $\Delta SD$ of the projection lens system 5 are programmed in advance. Each equation contains variables each corresponding to a change in pressure, temperature, humidity or a change in temperature of the projection lens system 5, with respect to a preset reference value. Also, equation (4) discussed above is programmed in this memory, such that by substituting the values of $\Delta \beta$ and $\Delta SD$ into equation (4), it is possible to obtain the amount of movement of the field lens 6 and the amount of movement of the reticle 1. It is to be noted that the equations for obtaining the values $\Delta \beta$ and $\Delta SD$ on the basis of the changes in pressure, temperature and in the temperature of the projection lens system, can be determined by experiments. On the other hand, the focus position of the pattern image formed by the projection lens system 5 changes depending upon the pressure, temperature and humidity around the projection lens system 5 as well as upon the temperature of the projection lens system 5. Additionally, it is changeable depending upon the positions of the reticle 1 and the field lens 6. Thus, in the present embodiment, on the basis of these variation factors, the calculating equations for obtaining the magnitude of the change in focus position of the projection lens system 5 are programmed in advance in the memory of the microprocessor 23 and, in accordance with the calculating equations, the focus position can be detected correctly.

The microprocessor 23 receives signals from the pressure sensor 19, the temperature sensor 20, the humidity sensor 21 and the lens temperature sensor 22, corresponding to the pressure, the temperature, the humidity and the lens temperature, and determines the amount of movement of the reticle 1 and the amount of the movement of the field lens 6 in accordance with the predetermined conditioning equations such as described hereinbefore. On the other hand, signals from the reticle position detector 15 and the lens position detector 17, corresponding to the positions of the reticle 1 and the field lens 6 (with respect to the direction of the optical axis AX), are applied to the microprocessor 23. In response, the microprocessor 23 supplies, to the reticle drive control system 13, a position signal of the reticle 1 and a signal corresponding to the amount of movement of the reticle 1 to be made, and also supplies, to the lens drive control system 16, a position signal of the field lens 6 and a signal corresponding to the amount of movement of the field lens 6 to be made. Then, in response to the signals from the microprocessor 23, the reticle drive control system 13 applies a suitable control signal to the reticle driving device 3 such that, by this reticle driving device 3, the reticle 1 is moved in the direction of the optical axis AX by a suitable amount. Also, in response to the signals from the microprocessor 23, the lens drive control system 16 applies a suitable control signal to the lens driving device 16 such that, by this lens driving device 16, the field lens 6 is moved in the direction of the optical axis AX by a suitable amount. By this adjustment of the position of the reticle 1 and the field lens 6, the projection magnification error and the distortion error of the pattern image due to the change in pressure, temperature or humidity around the projection lens system 5 or the temperature of the projection lens system 5, can be corrected.

Further, on the basis of the signals from the reticle position detector 15, the lens position detector 17, the pressure sensor 19, the temperature sensor 20, the humidity sensor 21 and the lens temperature sensor 22, the microprocessor 23 operates to detect the focus position of the pattern image formed by the projection lens system 5, and controls the wafer drive control system 14 in accordance with the signal from the focus detector 18 corresponding to the position of the wafer 9 (the surface thereof), so that the wafer 9 can be correctly positioned at the focus position. The wafer drive control system 14 applies a suitable control signal to the wafer driving device 11, such that, by this wafer driving system 11, the wafer 9 is moved in the direction of the optical axis AX, whereby the wafer 9 can be positioned at the focus position of the pattern image.

With the operation described hereinbefore, the projection magnification of the pattern image can be corrected to a predetermined magnification and the distortion of the pattern image can be reduced to a predetermined allowable range. By this, the pattern image can be correctly superposed on a pattern having been formed on the wafer 9 by the preceding process. Additionally, since the wafer 9 position can be made coincident with the focus position of the pattern image, a sharp pattern image can be projected on the wafer 9.

While in the present embodiment, the movable field lens 6 for adjustment of the projection magnification of the pattern image is constituted by one lens element ($G_1$), it may be constituted by plural lens elements. Also, while in the present embodiment the output signals of the pressure sensor 19, the temperature sensor 20, the humidity sensor 21 and the lens temperature sensor 22 are used for detection of any change in the projection magnification and distortion of the pattern image, resulting from the changes in pressure, temperature, humidity and lens temperature, it is a possible alternative that the pattern image as projected through the projection lens system 5 is picked up by using an image pickup device and any change in the projection magnification and distortion of the pattern image is detected on the basis of the size and shape of the pattern image, as in the foregoing embodiment. If, on that occasion, the image pickup device is mounted to the wafer stage 12, it is then possible to detect any change in the projection magnification or distortion of the pattern image at a desired moment and also, it is possible to avoid complicated structure of the exposure apparatus.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:
   a projection optical system for projecting an image of a pattern of a first object to a second object; and
   adjusting means for adjusting projection magnification and distortion of the projected image of the pattern, said adjusting means being operable to displace the first object and a lens element of said projection optical system in a direction of an optical axis of said projection optical system.

2. An apparatus according to claim 1, wherein said adjusting means includes first driving means for moving the first object and a second driving means for moving said lens element.

3. An apparatus according to claim 2, wherein said lens element is one of the lens elements of said projection optical system which is close to the first object.

4. An apparatus according to claim 2, further comprising:
   a pressure sensor for detecting any change in pressure surrounding said apparatus; and
   control means responsive to an output from said pressure sensor, for controlling said adjusting means.

5. An apparatus according to claim 4, further comprising:
   a first position sensor for detecting the position of said lens element;
   a second position sensor for detecting the position of the first object;
   wherein outputs of said first and second position sensors are applied to said control means and wherein, on the basis of the outputs of said first and second position sensors and of an output of said pressure sensor, said control means determines the amount of movement of each of the first object and said lens element to be made.

6. An apparatus according to claim 5, further comprising:
   a temperature sensor for detecting any change in temperature surrounding said apparatus; and
   a humidity sensor for detecting any change in humidity surrounding said apparatus;
   wherein outputs of said temperature sensor and said humidity sensor are applied to said control means and wherein, on the basis of the outputs of said temperature sensor and said humidity sensor, said control means determines the amount of movement of each of the first object and said lens element to be made.

7. An apparatus according to claim 5, further comprising:
   detecting means for detecting the position of the second object; and
   a driving mechanism for moving the second object in a direction of an optical axis of said projection optical system;
   wherein on the basis of signals from said pressure sensor and said detecting means, said control means controls said driving mechanism so as to position the second object at a focus position of said projection optical system.

8. An apparatus according to claim 1, wherein said adjusting means displaces the first object and said lens element substantially without causing a change in aberration of said projection optical system, other than symmetrical distortion aberration.

9. An apparatus according to claim 2, further comprising:
   image detecting means for taking an image of the pattern and for detecting any change thereof; and
   control means responsive to an output from said image detecting means, for controlling said adjusting means.

10. A projection exposure apparatus, comprising:
    a projection optical system for projecting an image of a pattern of a first object on a second object; said projection optical system being nontelecentric on the first object side and being telecentric on the second object side; and
    adjusting means for moving the first object in a direction of an optical axis of said projection optical system for adjustment of projection magnification of the image of the pattern, and for moving a lens element of said projection optical system which is close to the first object, in the direction of the optical axis of said projection optical system, for adjustment of distortion of the image of the pattern.

11. An apparatus according to claim 10, wherein said adjusting means displaces the first object and said lens element substantially without causing a change in aberration of said projection optical system, other than symmetrical distortion aberration.

12. A projection exposure apparatus, comprising:
    a projection optical system for projecting an image of a pattern of a first object on a second object, said projection optical system being telecentric both on the first object side and on the second object side; and
    adjusting means for moving a lens of said projection optical system close to the first object in a direction of an optical axis of said projection optical system, for adjustment of projection magnification of the image of the pattern, and for moving the first object in the direction of the optical axis of said projection optical system, for adjustment of distortion of the image of the pattern.

13. An apparatus according to claim 12, wherein said adjusting means displaces the first object and said lens element substantially without causing a change in aberration of said projection optical system, other than symmetrical distortion aberration.

14. A projection exposure apparatus, comprising:
a projection optical system, having an optical axis and including a plurality of lenses, for projecting a pattern of a mask onto a wafer; and
an adjusting means for changing an interval, with respect to the direction of the optical axis, between the mask and one of said plurality of lenses of said projection optical system, which lens is close to the mask, to compensate for distortion of said projection optical system.

15. An apparatus according to claim 14, wherein said projection optical system is telecentric on the mask side, and said adjusting means comprises means for displacing the mask in the direction of the optical axis to thereby compensate for the distortion.

16. An apparatus according to claim 14, wherein said projection optical system is non-telecentric on the mask side, and said adjusting means comprises means for displacing said one lens in the direction of the optical axis to thereby compensate for the distortion.

17. An apparatus according to claim 14, further comprising means for adjusting magnification of said projection optical system with respect to projection of the pattern.

18. An apparatus according to claim 15, further comprising means for adjusting magnification of said projection optical system with respect to projection of the pattern.

19. An apparatus according to claim 16, further comprising means for adjusting magnification of said projection optical system with respect to projection of the pattern.

20. In a semiconductor device manufacturing method including projecting an image of a circuit pattern of a mask onto a wafer through a projection optical system, the improvement comprising:
determining a change in distortion of the projection optical system; and
changing an interval between the mask and the projection optical system with respect to a direction of an optical axis of the projection optical system in accordance with the determination, so as to substantially correct any change in distortion.

21. In a semiconductor device manufacturing method including projecting an image of a circuit pattern of a mask onto a wafer through a projection lens system, the improvement comprising:
determining a change in each of distortion and magnification of the projection lens system; and
displacing, in accordance with the determination, the mask and a lens element of the projection lens system, which lens element is near the mask in a direction of an optical axis of the projection optical system, so as to substantially correct any changes in distortion and magnification.

22. In a semiconductor device manufacturing method including projecting an image of a circuit pattern of a mask onto a wafer through a projection optical system, the improvement comprising:
changing an interval between the mask and the projection optical system with respect to a direction of an optical axis of the projection optical system so as to substantially correct distortion of the projected image of the circuit pattern.

23. In a semiconductor device manufacturing method including projecting an image of a circuit pattern of a mask onto a wafer through a projection lens system, the improvement comprising:
displacing the mask and a lens of the projection lens system, which lens element is near the mask, so as to substantially correct any error in size and distortion of the projected image of the circuit pattern.

* * * * *

UNITED STATES PATENT AND TRADEMARK OFFICE
CERTIFICATE OF CORRECTION

PATENT NO. : 5,105,075
DATED : April 14, 1992
INVENTOR(S) : Masakatu Ohta, et al.

It is certified that error appears in the above-identified patent and that said Letters Patent is hereby corrected as shown below:

ON THE TITLE PAGE

IN FOREIGN APPLICATION PRIORITY DATA

"Sep. 19, 1988 [JP] Japan ... 1-234096
Aug. 30, 1989 [JP] Japan ... 64-226204"
should read:
--Sep. 19, 1988 [JP] Japan ... 63-234096
Aug. 30, 1989 [JP] Japan ... 1-226204--.

IN U.S. PATENT DOCUMENTS

"4,825,247 10/1989 Kemi et al." should read
--4,825,247 4/1989 Kemi, et al.--.

IN THE DISCLOSURE

COLUMN 5

Line 26, "$\Delta \beta = 26 \times S_1 + 5 \times \Delta D_3 \quad (2)$" should read
--$\Delta B = 26 \times \Delta S_1 + 5 \times \Delta D_3 \quad (1)$--.

Signed and Sealed this

Twentieth Day of July, 1993

Attest:

MICHAEL K. KIRK

Attesting Officer     Acting Commissioner of Patents and Trademarks